(12) United States Patent
Rinerson et al.

(10) Patent No.: US 7,042,035 B2
(45) Date of Patent: May 9, 2006

(54) MEMORY ARRAY WITH HIGH TEMPERATURE WIRING

(75) Inventors: Darrell Rinerson, Cupertino, CA (US); Steven W. Longcor, Mountain View, CA (US); Steve Kuo-Ren Hsia, San Jose, CA (US); Wayne Kinney, Emmett, ID (US); Edmond R. Ward, Monte Sereno, CA (US); Christophe J. Chevallier, Palo Alto, CA (US)

(73) Assignee: Unity Semiconductor Corporation

( * ) Notice: Subject to any disclaimer, the term of this patent is extended or adjusted under 35 U.S.C. 154(b) by 0 days.

(21) Appl. No.: 10/765,406

(22) Filed: Jan. 26, 2004

(65) Prior Publication Data

US 2004/0159869 A1   Aug. 19, 2004

Related U.S. Application Data

(63) Continuation-in-part of application No. 10/682,277, filed on Oct. 8, 2003, which is a continuation-in-part of application No. 10/330,512, filed on Dec. 26, 2002, now Pat. No. 6,753,561.

(60) Provisional application No. 60/400,849, filed on Aug. 2, 2002, provisional application No. 60/422,922, filed on Oct. 31, 2002, provisional application No. 60/424,083, filed on Nov. 5, 2002.

(51) Int. Cl.
*H01L 31/113* (2006.01)
*H01L 31/062* (2006.01)

(52) U.S. Cl. ............... 257/295; 257/421; 257/E27.104
(58) Field of Classification Search ............... 257/295, 257/421, E27.104
See application file for complete search history.

(56) References Cited

U.S. PATENT DOCUMENTS

| | | | | |
|---|---|---|---|---|
| 4,882,652 A * | 11/1989 | Furukawa et al. | ....... | 361/321.5 |
| 5,126,283 A * | 6/1992 | Pintchovski et al. | ........ | 438/396 |
| 5,414,301 A * | 5/1995 | Thomas | ....................... | 257/740 |
| 6,034,882 A * | 3/2000 | Johnson et al. | ............. | 365/103 |
| 6,297,103 B1 * | 10/2001 | Ahn et al. | ................... | 438/275 |
| 6,331,944 B1 * | 12/2001 | Monsma et al. | ............ | 365/171 |
| 6,424,565 B1 * | 7/2002 | Brug et al. | .................. | 365/171 |
| 6,473,332 B1 * | 10/2002 | Ignatiev et al. | ............. | 365/148 |
| 6,544,801 B1 * | 4/2003 | Slaughter et al. | .............. | 438/3 |
| 6,569,745 B1 * | 5/2003 | Hsu | ........................... | 438/385 |
| 6,636,436 B1 * | 10/2003 | Perner | ........................ | 365/158 |
| 6,693,821 B1 * | 2/2004 | Hsu et al. | .................... | 365/158 |
| 6,730,575 B1 * | 5/2004 | Eldridge | ..................... | 438/396 |
| 6,794,052 B1 * | 9/2004 | Schultz et al. | ............. | 428/500 |
| 2001/0017798 A1 * | 8/2001 | Ishii | ........................... | 365/200 |
| 2001/0044185 A1 * | 11/2001 | Nomoto et al. | ............. | 438/261 |
| 2003/0179617 A1 * | 9/2003 | Gudesen et al. | ............ | 365/200 |
| 2003/0218902 A1 * | 11/2003 | Perner et al. | ............... | 365/158 |
| 2004/0235247 A1 * | 11/2004 | Hsu et al. | ................... | 438/257 |

* cited by examiner

*Primary Examiner*—Tu-Tu Ho (57) ABSTRACT

A memory array with components that can withstand high temperature fabrication is provided. Some memory materials require high temperature process steps in order to achieve desired properties. During fabrication, a memory material is deposited on structures that may include metal lines and barrier layers. Such structures are then exposed to the high temperature processing steps and should be resistant to such temperatures.

47 Claims, 8 Drawing Sheets

MEMORY ARRAY WITH HIGH TEMPERATURE WIRING

BACKGROUND OF THE INVENTION

1. Field of the Invention

The present invention relates generally to computer memory, and more specifically to semiconductor memory fabrication.

2. Description of the Related Art

Memory can either be classified as volatile or nonvolatile. Volatile memory is memory that loses its contents when the power is turned off. In contrast, non-volatile memory does not require a continuous power supply to retain information. Most non-volatile memories use solid-state memory devices as memory elements.

Certain conductive metal oxides (CMOs), for example, can be used as solid-state memory devices. The CMOs can retain a resistive state after being exposed to an electronic pulse, which can be delivered through two terminals. U.S. Pat. No. 6,204,139, issued Mar. 20, 2001 to Liu et al., incorporated herein by reference for all purposes, describes some perovskite materials that exhibit such characteristics. The perovskite materials are also described by the same researchers in "Electric-pulse-induced reversible resistance change effect in magnetoresistive films," Applied Physics Letters, Vol. 76, No. 19, 8 May 2000, and "A New Concept for Non-Volatile Memory: The Electric-Pulse Induced Resistive Change Effect in Colossal Magnetoresistive Thin Films," in materials for the 2001 Non-Volatile Memory Technology Symposium, all of which are hereby incorporated by reference for all purposes. However, the materials described in the U.S. Pat. No. 6,204,139 patent are not generally applicable to RAM memory because the resistance of the material, when scaled to small dimensions, is considered to be too large to make a memory with fast access times.

In U.S. Pat. No. 6,531,371 entitled "Electrically programmable resistance cross point memory" by Hsu et al, incorporated herein by reference for all purposes, resistive cross point memory devices are disclosed along with methods of manufacture and use. The memory device comprises an active layer of perovskite material interposed between upper electrodes and lower electrodes.

Similarly, the IBM Zurich Research Center has also published three technical papers that discuss the use of metal oxide material for memory applications: "Reproducible switching effect in thin oxide films for memory applications," Applied Physics Letters, Vol. 77, No. 1, 3 Jul. 2000, "Current-driven insulator-conductor transition and nonvolatile memory in chromium-doped $SrTiO_3$ single crystals," Applied Physics Letters, Vol. 78, No. 23, 4 Jun. 2001, and "Electric current distribution across a metal-insulator-metal structure during bistable switching," Journal of Applied Physics, Vol. 90, No. 6, 15 Sep. 2001, all of which are hereby incorporated by reference for all purposes.

The discovery of the resistance-changing property of certain CMOs, however, is relatively recent and has not yet been implemented in a commercial memory product. There are continuing efforts to bring a true non-volatile RAM (nvRAM) to market.

SUMMARY OF THE INVENTION

In one aspect of the invention a cross point memory array is provided. The cross point memory includes a substrate, a memory array, a bottom refractory metal layer and a top metal layer. The bottom refractory metal layer is parallel to the deposition face of the substrate and patterned into bottom conductive array lines. The top metal layer is also parallel to the deposition face of the substrate and patterned into top conductive array lines. Each memory cell of the memory array is at least partially defined by the intersection of a bottom conductive array line and a top conductive array line.

In another aspect of the invention, each memory cell of a memory array includes a multi-resistive state element formed with a high-temperature fabrication process at a high temperature. A plurality of conductive lines is beneath the multi-resistive state element and is stable at the high temperature. Additionally, a plurality of conductive lines is above the multi-resistive state element.

In yet another aspect of the invention, a method of manufacturing a memory is provided. A semiconductor substrate is initially provided. A bottom plurality of layers that are stable at a first temperature are then formed. Afterwards, a multi-resistive state element layer at the first temperature is formed. Then, a top plurality of layers is formed such that at least one of the layers in the top plurality of layers is not stable at the first temperature.

Other aspects of the invention will become apparent from the following detailed description taken in conjunction with the accompanying drawings which illustrate, by way of example, the principles of the invention.

BRIEF DESCRIPTION OF THE DRAWINGS

The invention may best be understood by reference to the following description taken in conjunction with the accompanying drawings, in which.

It is to be understood that, in the drawingw, like reference numerals designate like structural elements. Also, it is understood that the depictions in the FIGS. are not necessarily to scale.

DETAILED DESCRIPTION OF THE PREFERRED EMBODIMENTS

In the following description, numerous specific details are set forth to provide a thorough understanding of the present invention. It will be apparent, however, to one skilled in the art that the present invention may be practiced without some or all of these specific details. In other instances, well known process steps have not been described in detail in order to avoid unnecessarily obscuring the present invention.

Overview

Some memory materials require high temperature process steps in order to achieve desired properties, such as crystallinity or dopant concentration. During fabrication, a memory material is deposited on structures that may include metal lines and barrier layers. Such structures are then exposed to the high temperature processing steps and should be resistant to such temperatures.

The Memory Array

Conventional nonvolatile memory requires three terminal MOSFET-based devices. The layout of such devices is not ideal, usually requiring an area of at least $8f^2$ for each memory cell, where f is the minimum feature size. However, not all memory elements require three terminals. If, for example, a memory element is capable of changing its electrical properties (e.g., resistivity) in response to a voltage pulse, only two terminals are required. With only two terminals, a cross point array layout that allows a single cell to be fabricated to a size of $4f^2$ can be utilized. Co-pending U.S. patent application, "Cross Point Memory Array Using Multiple Thin Films," U.S. application Ser. No. 10/330,512, filed Dec. 26, 2002, incorporated herein by reference in its entirety and for all purposes, describes such a device.

Figure 1A:
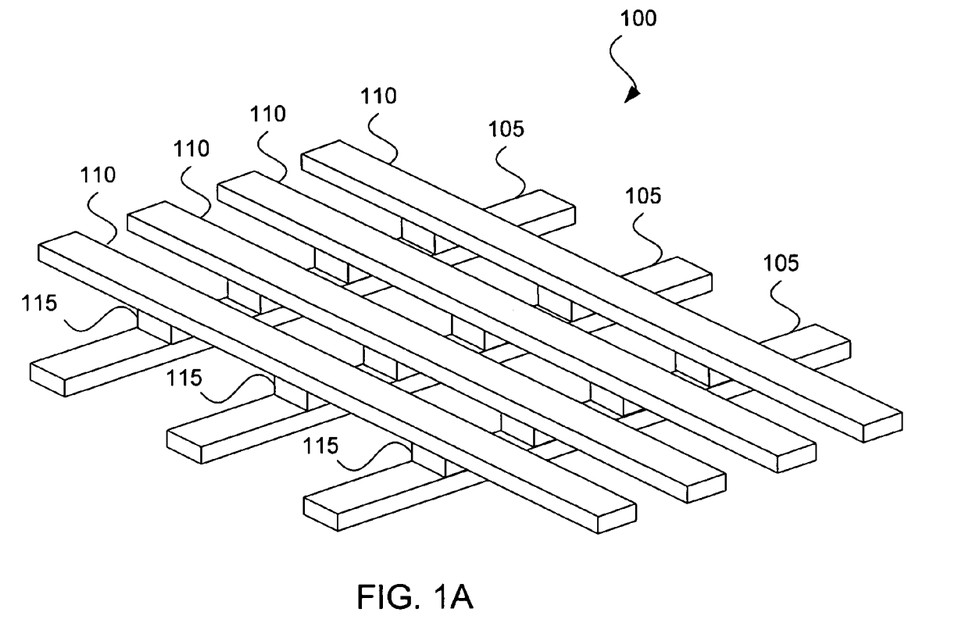
FIG. 1A depicts a perspective view of an exemplary cross point memory array employing a single layer of memory.

FIG. 1A depicts a perspective view of an exemplary cross point memory array 100 employing a single layer of memory. A bottom layer of x-direction conductive array lines 105 is orthogonal to a top layer of y-direction conductive array lines 110. The x-direction conductive array lines 105 act as a first terminal and the y-direction conductive array lines 110 act as a second terminal to a plurality of memory plugs 115, which are located at the intersections of the conductive array lines 105 and 110. The conductive array lines 105 and 110 are used to both deliver a voltage pulse to the memory plugs 115 and carry current through the memory plugs 115 in order to determine their resistive states.

Depending upon the material, a conductive array line would typically cross between 64 and 8192 perpendicular conductive array lines. Fabrication techniques, feature size and resistivity of material may allow for shorter or longer lines. Although the x-direction and y-direction conductive array lines can be of equal lengths (forming a square cross point array) they can also be of unequal lengths (forming a rectangular cross point array).

Figure 2A:
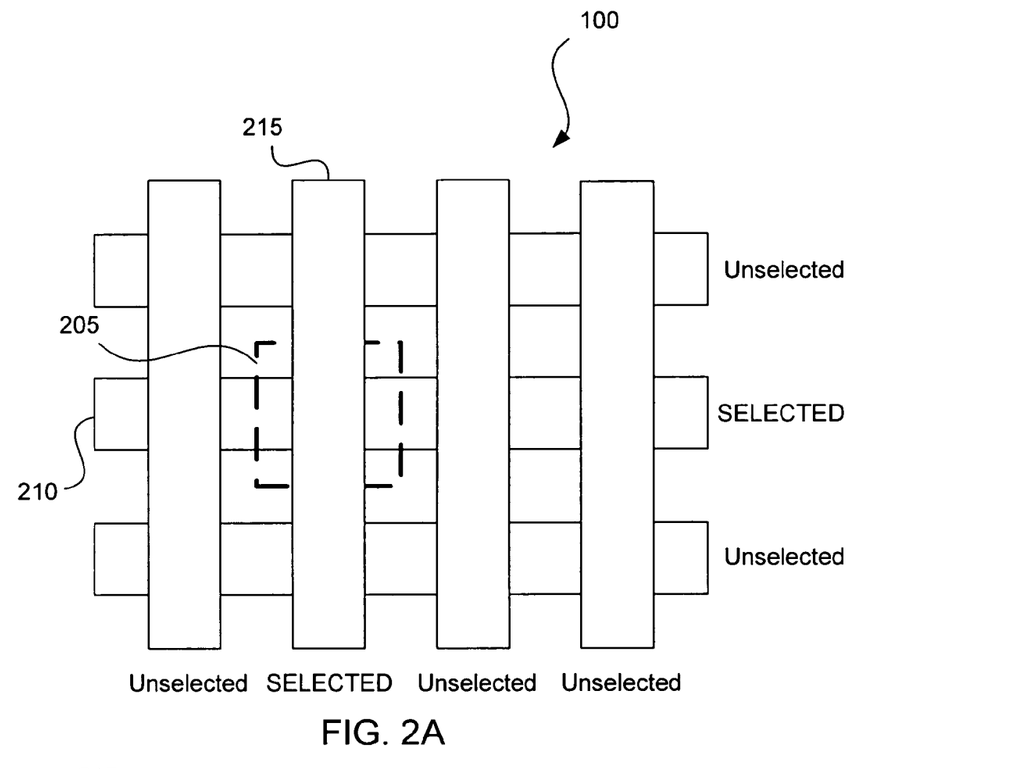
FIG. 2A depicts a plan view of selection of a memory cell in the cross point array depicted in FIG. 1A.
Figure 2B:
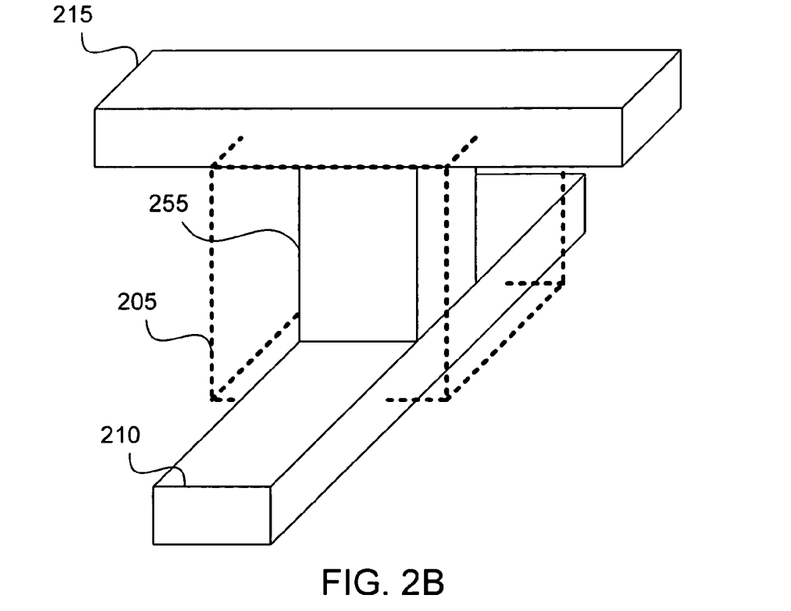
FIG. 2B depicts a perspective view of the boundaries of the selected memory cell depicted in FIG. 2A.

FIG. 2A illustrates selection of a memory cell 205 in the cross point array 100. The point of intersection between a single x-direction conductive array line 210 and a single y-direction conductive array line 215 uniquely identifies the single memory cell 205. FIG. 2B illustrates the boundaries of the selected memory cell 205. The memory cell is a repeatable unit that can be theoretically extended in one, two or even three dimensions. One method of repeating the memory cells in the z-direction (orthogonal to the x-y plane) is to use both the bottom and top surfaces of conductive array lines 105 and 110.

Figure 1B:
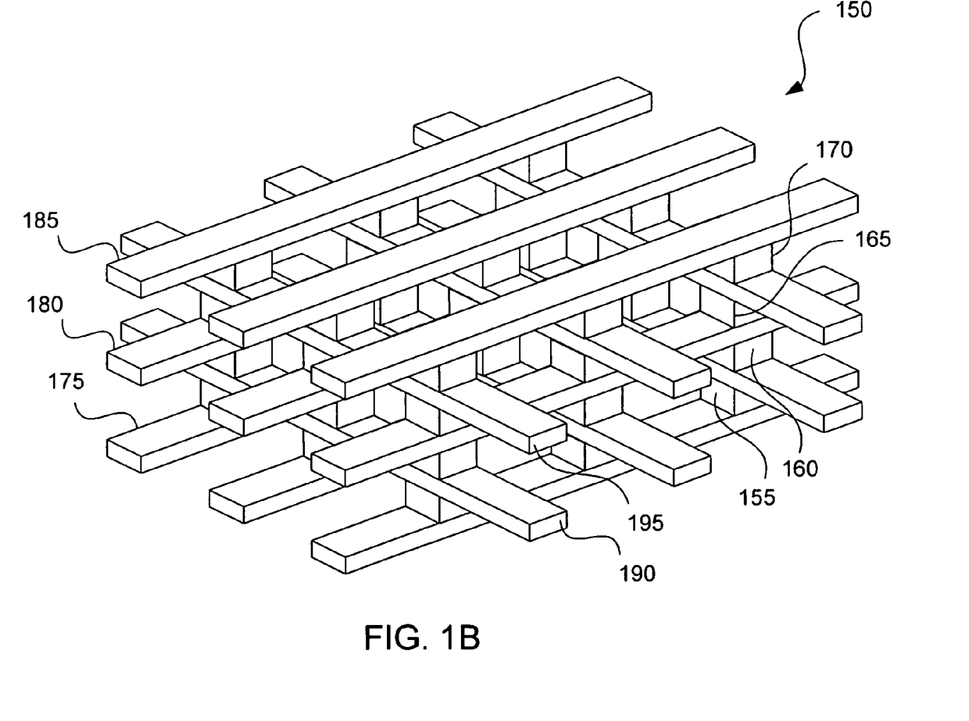
FIG. 1B depicts a perspective view of an exemplary stacked cross point memory array employing four layer of memory.

FIG. 1B depicts an exemplary stacked cross point array 150 employing four memory layers 155, 160, 165, and 170. The memory layers are sandwiched between alternating layers of x-direction conductive array lines 175, 180 and 185 and y-direction conductive array lines 190 and 195 such that each memory layer 155, 160, 165, and 170 is associated with only one x-direction conductive array line layer and one y-direction conductive array line layer. Although the top conductive array line layer 185 and bottom conductive array line layer 175 are only used to supply voltage to a single memory layer 155 and 170, the other conductive array line layers 180, 190, and 195 can be used to supply voltage to both a top and a bottom memory layer 155, 160, 165, or 170. Co-pending U.S. patent application, "Re-Writable Memory With Multiple Memory Layers," U.S. application Ser. No. 10/612,191, filed Jul. 1, 2003, incorporated herein by reference in its entirety for all purposes, describes stacked cross point arrays.

Referring back to FIG. 2B, the repeatable cell that makes up the cross point array 100 can be considered to be a memory plug 255, plus ½ of the space around the memory plug, plus ½ of an x-direction conductive array line 210 and ½ of a y-direction conductive array line 215. Of course, ½ of a conductive array line is merely a theoretical construct, since a conductive array line would generally be fabricated to the same width, regardless of whether one or both surfaces of the conductive array line was used. Accordingly, the very top and very bottom layers of conductive array lines (which use only one surface) would typically be fabricated to the same size as all other layers of conductive array lines.

One benefit of the cross point array is that the active circuitry that drives the cross point array 100 or 150 can be placed beneath the cross point array, therefore reducing the footprint required on a semiconductor substrate. Co-pending U.S. patent application, "Layout Of Driver Sets In A Cross Point Memory Array," U.S. application Ser. No. 10/612,733, filed Jul. 1, 2003, incorporated herein by reference in its entirety for all purposes, describes various circuitry that can achieve a small footprint underneath both a single layer cross point array 100 and a stacked cross point array 150. Further details of the peripheral circuitry are described in co-pending U.S. patent application, "An Adaptive Programming Technique for a Re-Writeable Conductive Memory Device," U.S. application Ser. No. 10/680,508, filed Oct. 6, 2003, incorporated herein by reference in its entirety for all purposes.

Figure 1C:
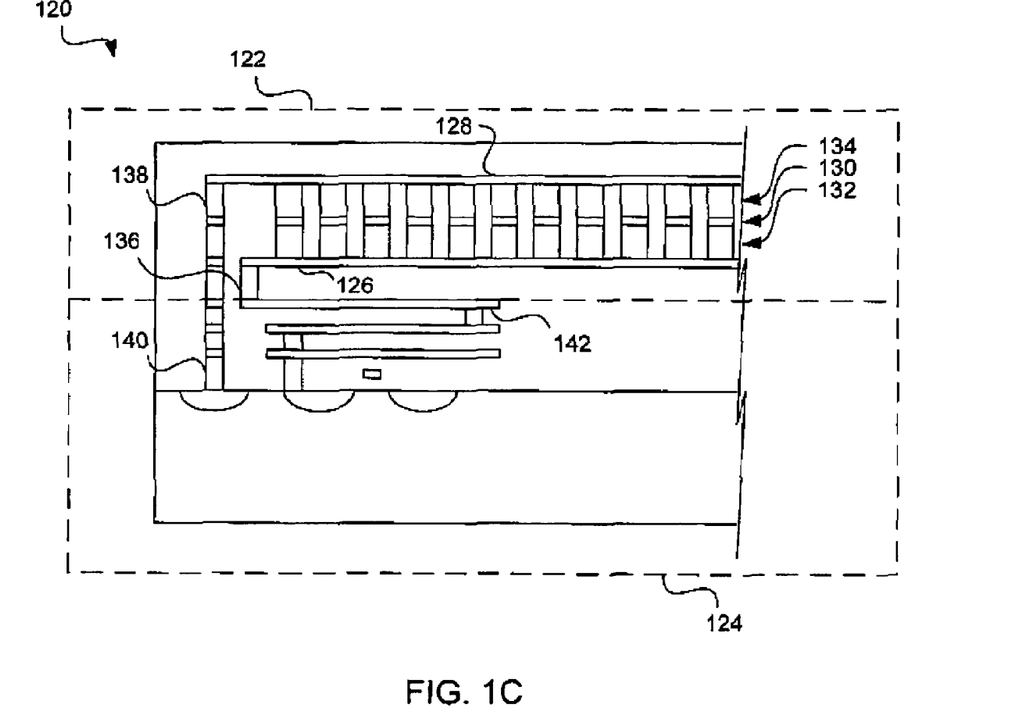
FIG. 1C depicts a cross section of a two layer stacked cross point array positioned over circuitry.

FIG. 1C depicts a cross-section of an exemplary high-density NVRAM 120 having two memory layer in a stacked cross point array configuration. The high-density NVRAM 120 is preferably made up an array portion 122 and a memory circuit portion 124. The memory circuit portion 124 contains all of the active devices (devices that require a source of energy for their operation, such as transistors and amplifiers) needed to operate the high-density NVRAM 120. Those skilled in the art will recognize that standard fabrication techniques (e.g. CMOS processing) can be used to manufacture the memory circuit portion 124.

The array portion 122 includes a first layer of x-direction conductive array lines ($X_0$ layer) 126, a second layer of x-direction conductive array lines ($X_1$ layer) 128, a layer of y-direction conductive array lines ($Y_0$ layer) 130, a first memory plug layer ($ML_0$) 132 situated between the $X_0$ layer 126 and the $Y_0$ layer 130, a second memory plug layer ($ML_1$) 134 situated between the $Y_0$ layer 130 and the $X_1$ layer 128, a first plurality of $X_0$ thrus 136 and a first plurality of $X_1$ thrus 138. A plurality of vias 140 and metallization layers 142 together provide conductive paths from components of the memory circuit portion 124 to memory cells of the array portion 122. Similarly, the thrus 136 and 138 provide conductive paths from memory cells of the array portion 122 to the memory circuit portion 124. It should be noted that the thrus of the array portion 122 must be conductive and, therefore, will have different electrical properties that the memory layers at the same height.

The cross point array is not the only type of memory array that can be used with a two-terminal memory element. For example, a two-dimensional transistor memory array can incorporate a two-terminal memory element. While the memory element in such an array would be a two-terminal device, the entire memory cell would be a three-terminal device.

Figure 3:
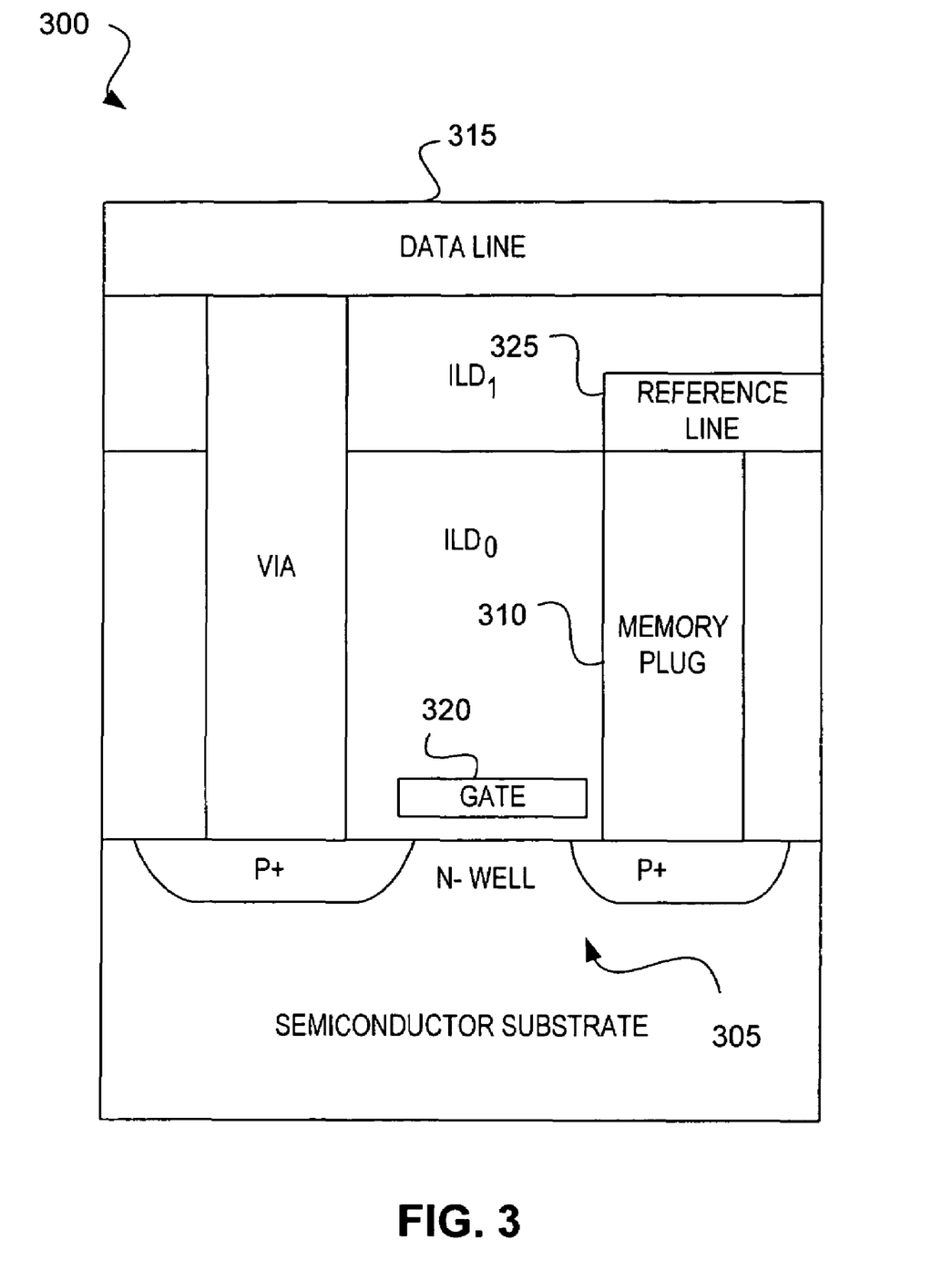
FIG. 3 depicts a generalized representation of a memory cell that can be used in a transistor memory array.

FIG. 3 is a generalized diagrammatic representation of a memory cell 300 that can be used in a transistor memory array. Each memory cell 300 includes a transistor 305 and a memory plug 310. The transistor 305 is used to permit current from the data line 315 to access the memory plug 310 when an appropriate voltage is applied to the select line 320, which is also the transistor's gate. The reference line 325 might span two cells if the adjacent cells are laid out as the mirror images of each other. Co-pending U.S. patent application, "Non-Volatile Memory with a Single Transistor and Resistive Memory Element," U.S. application Ser. No. 10/249,848, filed May 12, 2003, incorporated herein by reference in its entirety for all purposes, describes the specific details of designing and fabricating a transistor memory array.

The Memory Plug

Each memory plug 255 or 310 contains a multi-resistive state element (described later) along with any other materials that may be desirable for fabrication or functionality. For example, the additional materials might include a non-ohmic device, as is described in co-pending application "High Density NVRAM," U.S. application Ser. No. 10/360,005, filed Feb. 7, 2003, incorporated herein by reference in its entirety for all purposes. The non-ohmic device exhibits a very high resistance regime for a certain range of voltages ($V_{NO-}$ to $V_{no+}$) and a very low resistance regime for voltages above and below that range. The non-ohmic device, either alone or in combination with other elements, may cause the memory plug 255 or 310 to exhibit a non-linear resistive characteristic. Exemplary non-ohmic devices include three-film metal-insulator-metal (MIM) structures and back-to-back diodes in series.

Figure 2C:
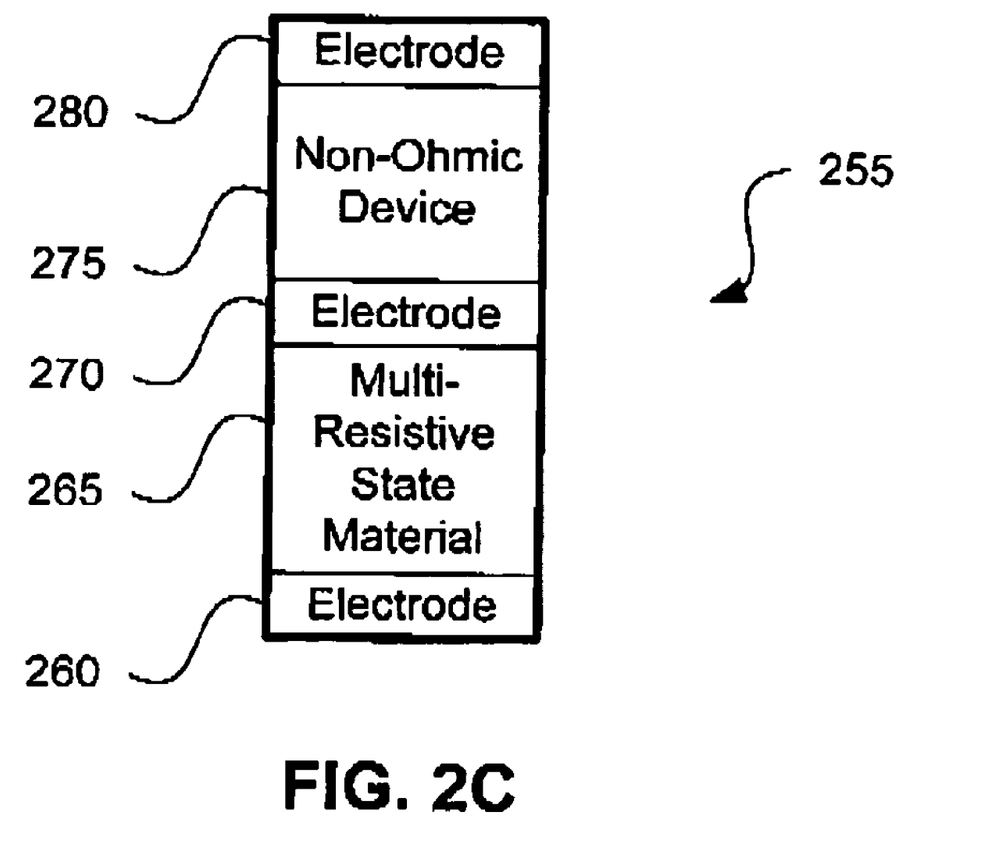
FIG. 2C depicts a cross section of the memory cell depicted in FIG. 2A.

FIG. 2C depicts a side view of an exemplary five-layer memory plug 255 with a non-ohmic device. The five layers are: a first electrode layer 260, a layer of a multi-resistive state element 265. a second electrode layer 270, a layer making up the non-ohmic device 275, and a third electrode 280. Some layers may actually be made up of multiple thin films. For example, one type of non-ohmic device 275 uses a three film metal-insulator-metal (MIM) structure. Additionally, certain multi-resistive state elements use multiple thin films (see FIG. 2D). Furthermore, not all the layers are required for every memory plug 255 or 310 (see FIG. 3) configuration. For example, certain cross point arrays may use means other than the non-ohmic device 275 to prevent unselected memory plugs from being disturbed.

In an alternative embodiment, at least one additional interface can be created within the multi-resistive state element by adding an additional conductive metal oxide layer.

The additional conductive metal oxide layer need not comprise the same material, however, interfaces between conductive metal oxide layers are difficult areas to control. As can be appreciated by one skilled in the art, mismatched lattices, possible inter-atom diffusion mechanisms, and adhesion issues are all relevant. Therefore, using substantially similar materials is one way to avoid such control issues.

Including dopants in only a portion of the conductive metal oxide, or using different dopants in adjacent portions allows the use of substantially similar materials for the conductive metal oxide layers, thus avoiding the control issues while imparting enough differences between the substantially similar materials to constitute and create an active interface. Additionally, dopants may Impart additional benefits, such as enhancing the memory effect of the memory element by creating traps.

Figure 2D:
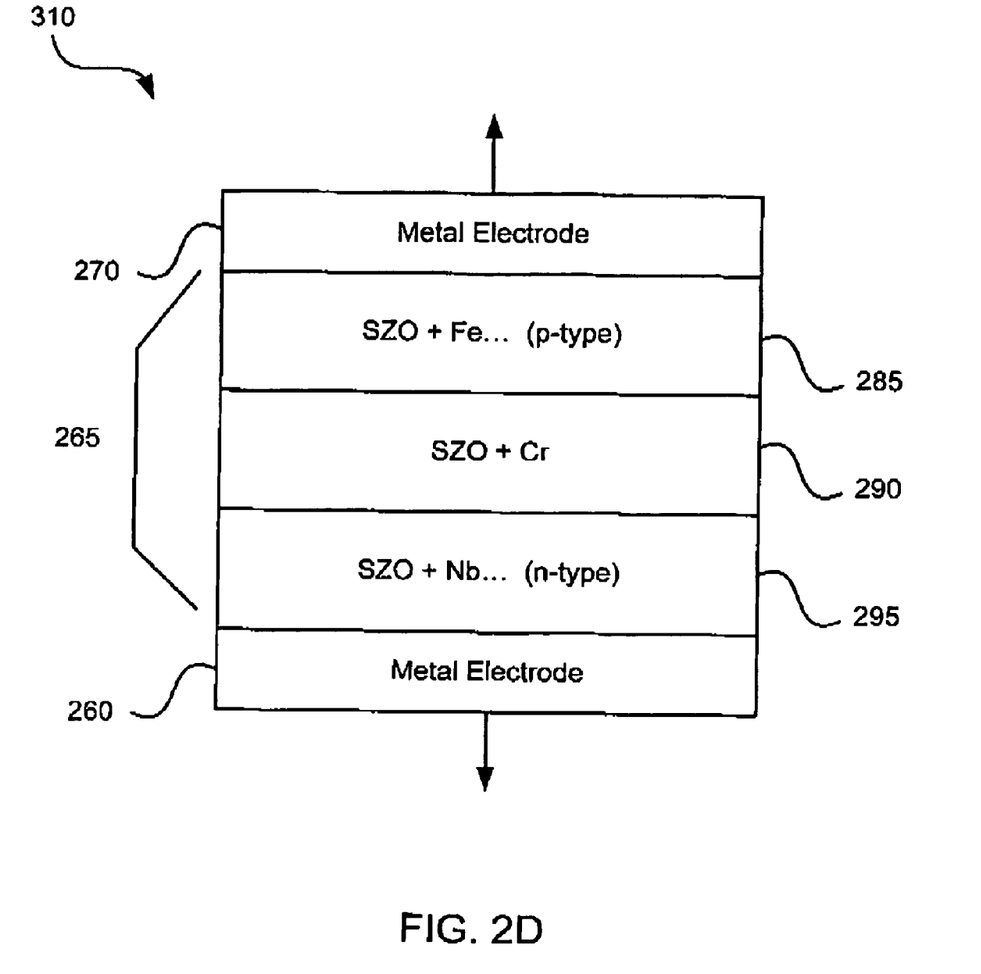
FIG. 2D de depicts a cross section of a portion of the memory cell depicted in FIG. 2A.

Thus, for example, in one aspect of the present invention, FIG. 2D depicts a cross sectional view of an exemplary memory plug 310. In this example, a conductive metal oxide layer 290 that includes a metal oxide strontium zirconate doped with chromium is sandwiched between two substantially similar conductive metal oxide layers 285 and 295. The top conductive metal oxide layer is strontium zirconate doped with iron, which results in a p-type metal oxide layer 285. The bottom conductive metal oxide layer is strontium zirconate doped with niobium, which results in an n-type metal oxide layer 295.

In similar fashion, one skilled in the art can appreciate that only two layers of conductive metal oxides may be utilized without departing from the scope of the present invention.

As another example of the present invention, it is also possible to use different materials to form the conductive metal oxide layers, as long as these materials are compatible.

Furthermore, as described in "Rewriteable Memory With Non-Linear Memory Element," U.S. application Ser. No. 10/604,556, filed Jul. 30, 2003, incorporated herein by reference in its entirety for all purposes, it may also be possible for the memory cell exhibit non-linear characteristics without a separate non-ohmic device. It should be noted that since it is possible for a memory cell to exhibit non-linear characteristics the terms "resistive memory" and "resistive device" also apply to memories and devices showing non-linear characteristics, and can also be referred to as "conductive memory" and "conductive device." While a non-ohmic device might be desirable in certain arrays, it may not be helpful in other arrays.

Electrodes will typically be desirable components of the memory plugs 255 or 310, a pair of electrodes sandwiching the multi-resistive state element. If the only purpose of the electrodes is as a barrier to prevent metal inter-diffusion, then a thin layer of metal, e.g. TiN, Pt, Au, Ag and Al. could be used. However, conductive oxide electrodes may provide advantages beyond simply acting as a metal inter-diffusion barrier. Co-pending U.S. patent application, "Conductive Memory Device With Barrier Electrodes," U.S. application Ser. No. 10/682,277, filed Oct. 8, 2003, incorporated herein by reference in its entirety for all purposes, describes electrodes (formed either with a single layer or multiple layers) that prevent the diffusion of metals, oxygen, hydrogen and water, act as a seed layer in order to form a good lattice match with the conductive memory element, include adhesion layers, and reduce stress caused by uneven coefficients of thermal expansion, and provide other benefits. Additionally, the choice of electrode layers in combination with the multi-resistive state element layer may affect the properties of the memory plug 255 or 310, as is described in co-pending U.S. patent application, "Resistive Memory Device With A Treated Interface," U.S. application Ser. No. 10/665,882, filed Sep. 19, 2003, incorporated herein by reference in its entirety for all purposes. The multi-resistive state element will generally (but not necessarily) be crystalline—either as a single crystalline structure or a polycrystalline structure. One class of multi-resistive state element are perovskites that include two or more metals, the metals being selected from the group consisting of transition metals, alkaline earth metals and rare earth metals. The perovskites can be any number of compositions, including manganites (e.g., $Pr_{0.7}Ca_{0.3}MnO_3$, $Pr_{0.5}Ca_{0.5}MnO_3$ and other PCMOs, LCMOs, etc.), titanates (e.g., STO:Cr), zirconates (e.g., SZO:Cr), other materials such as $Ca_2Nb_2O_7$:Cr, and $Ta_2O_5$: Cr, and high Tc superconductors (e.g., YBCO). Specifically, $MnO_3$, when combined with the rare earth metals La, Pr or some combination thereof and the alkaline earth metals Ca, Sr or some combination thereof have been found to produce a particularly effective multi-resistive state element for use in the memory plug 255 or 310. The compounds that make up the perovskite class of multi-resistive state elements include both simple conductive metal oxides and complex conductive metal oxides. Further, some oxides that may not be conductive in their pure form may be used as they become conductive through the addition of dopants, or if they are used as a very thin layer (e.g., in the order of tens of Angstroms) in which case tunneling conduction can be achieved. Therefore, as will be appreciated by those skilled in the art, the terms "conductive memory" and "conductive device" can include devices that are fabricated with materials that are classified as insulators, but are thin enough to allow tunneling conduction.

Multi-resistive state elements, however, are not limited to perovskites. Specifically, any material that has a hysteresis that exhibits a resistive state change upon application of a voltage while allowing non-destructive reads is a good candidate for a multi-resistive state element. A non-destructive read means that the read operation has no effect on the resistive state of the memory element. Measuring the resistance of a memory cell is accomplished by detecting either current after the memory cell is held to a known voltage, or voltage after a known current flows through the memory cell. Therefore, a multi-resistive state material that is placed in a high resistive state $R_0$ upon application of $-V_W$ and a low resistive state $R_1$ upon application of $+V_W$ should be unaffected by a read operation performed at $-V_R$ or $+V_R$. In such materials a write operation is not necessary after a read operation. The same principle applies if more that one resistive state is used to store information (e.g., the multi-resistive state element has a high resistive state of $R_{00}$, a medium-high resistive state of $R_{01}$, a medium-low resistive state of $R_{10}$ and a low resistive state of $R_{11}$).

As described in co-pending U.S. patent application, "A 2-Terminal Trapped Charge Memory device with Voltage Switchable Multi-Level Resistance," U.S. application Ser. No. 10/634,636, filed Aug. 4, 2003, incorporated herein by reference in its entirety for all purposes, trapped charges are one mechanism by which the hysteresis effect is created. Trapped charges can be encouraged with dopants, as described in co-pending U.S. patent application, "Multi-Resistive State Material that Uses Dopants," U.S. application Ser. No. 10/604,606, filed Aug. 4, 2003, incorporated herein by reference in its entirety for all purposes.

Fabrication

Figure 4:
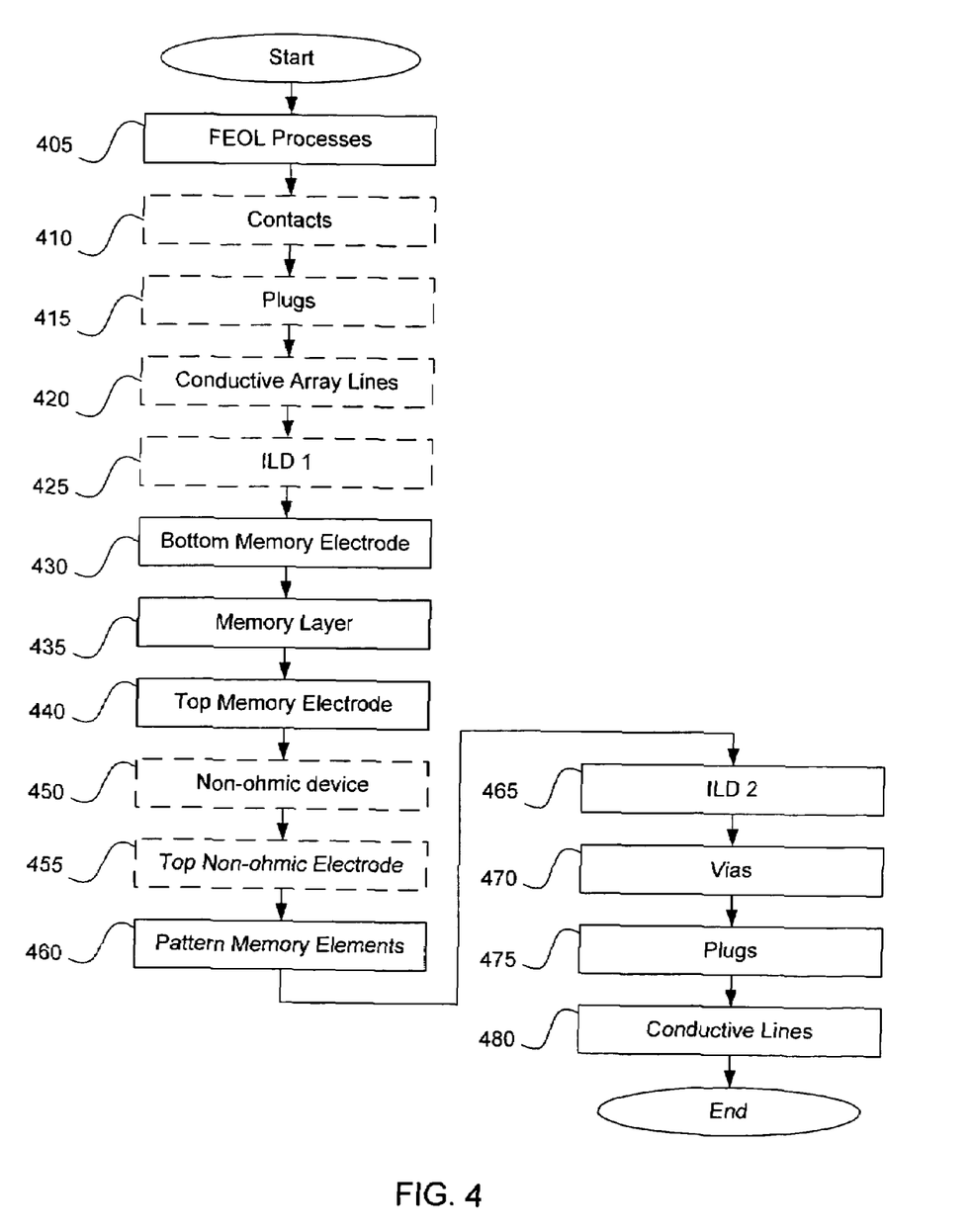
FIG. 4 depicts an exemplary flow chart of various processing steps that could be involved in fabrication of a memory.

FIG. 4 is an exemplary flow chart of various processing steps that could be involved in fabrication of a memory. At 405, standard front end of line (FEOL) processes can be used to form the active circuitry that drives the cross point memory array. FEOL processes are generally defined as operations performed on a semiconductor wafer in the course of device manufacturing up to first metallization, and might end with chemical-mechanical polishing (CMP) of an inter-layer dielectric (ILD). Certain cross point arrays, especially those with active circuitry underneath the memory array, might also include various metallization layers in step 405. The metallization layers are used to electrically connect the active circuitry to the conductive array lines of the cross point array 100 or 150.

The next processing step at 410 is formation of contact holes through the ILD to appropriate positions in the active circuitry (or metallization layers in the case of some cross point arrays) followed by plug formation at 415. Certain transistor memory arrays may require these steps if, for example, the memory plug 310 were so wide that it would overlap the transistor's gate 320. Otherwise, the memory plug 310 could be formed directly on top of the semiconductor substrate 305.

Once the plugs are formed, a cross point array 100 or 150 would require that the conductive array lines be patterned on the wafer at 420. If refractory metals with relatively high resistivities are used for the conductive array lines, the maximum length and minimum cross-sectional area may be limited in comparison to aluminum or copper.

Another ILD layer could be deposited over the first layer of conductive array lines at 425. The dielectric layer can be deposited over the conductive array lines by plasma-enhanced chemical vapor deposition (PECVD) and then planarized by CMP to expose the top surfaces of the conductive array lines.

At 430 the memory plug formation begins. In the case of transistor memory array, the memory plug can be formed directly on the contact hole plugs. In the case of a cross point array, the memory plugs are formed on the bottom conductive array lines.

Regardless of the memory array, a memory plug generally begins with the deposition of the bottom electrodes at 430. At 435 the multi-resistive state elements are deposited, typically using high temperature processing (e.g., solution based spin on followed by high temperature anneal, pulsed laser deposition, sputtering, and metal-organic chemical vapor deposition). However, co-pending U.S. patent applications, "Laser Annealing of Complex Metal Oxides (CMO) Memory Materials for Non-Volatile Memory Integrated Circuits," U.S. application Ser. No. 10/387,799, and "Low Temperature Deposition of Complex Metal Oxides (CMO) Memory Materials for Non-Volatile Memory Integrated Circuits," U.S. application Ser. No. 10/387,799, both filed Mar. 13, 2003, and both incorporated herein by reference in their entireties for all purposes, describe fabrication techniques that may be able to be used in lieu of high temperature fabrication processes. If high temperature fabrication were used, then all the circuitry elements that were deposited before the multi-resistive state element would need to withstand those high temperatures. Using refractory metals is one technique that can be used to create elements that can endure high temperatures.

It should also be appreciated that fabrication of the multi-resistive state element might include additional techniques in order to ensure an effective memory device. For example, biasing the multi-resistive state element might be beneficial in order to ensure the hysteresis is presented in a certain direction. Co-pending U.S. patent application, "Multi-Layer Conductive Memory Device," U.S. application Ser. No. 10/605,757, filed Oct. 23, 2003, incorporated herein by reference in its entirety for all purposes describes using a multi-layered multi-resistive state element in order to encourage a hysteresis in a certain direction.

At 440 another electrode is deposited on top of the multi-resistive state element. At 450 the optional non-ohmic device is formed. If the non-ohmic device is a MIM structure, a top electrode layer may or may not be necessary at 455. In addition, this top electrode layer could include a barrier layer to prevent metal inter-diffusion.

At 460 standard photolithography and appropriate multi-step etch processes could be used to pattern the memory/non-ohmic film stack into memory cell plugs. Co-pending U.S. patent application, "Conductive Memory Stack With Non-Uniform Width," U.S. application Ser. No. 10/605,963, filed Nov. 10, 2003, incorporated herein by reference in its entirety for all purposes describes an improved fabrication technique that includes etching a memory plug with a non-uniform width and using a sidewall layer around the memory plug.

At 465 depositing another ILD, which can then be planarized by CMP, fills in the spaces between the plugs. At 470 via holes are formed in the ILD. Via holes could be formed to connect the tops of the memory cell islands and are one mechanism that can be used to provide connections between metal interconnect layers. The via holes are then filled at 475.

The top layer(s) of conductive lines could then be formed at 480. For cross point array a single conductive array line would complete the memory cell 205. For a transistor memory array the data line 315 and the reference line 325 would still need to be formed. Regardless, if there are no more memory elements to form at high temperatures, the final layer(s) of conductive lines may comprise aluminum, copper or other high conductivity metal using standard metallization processes.

Figure 5:
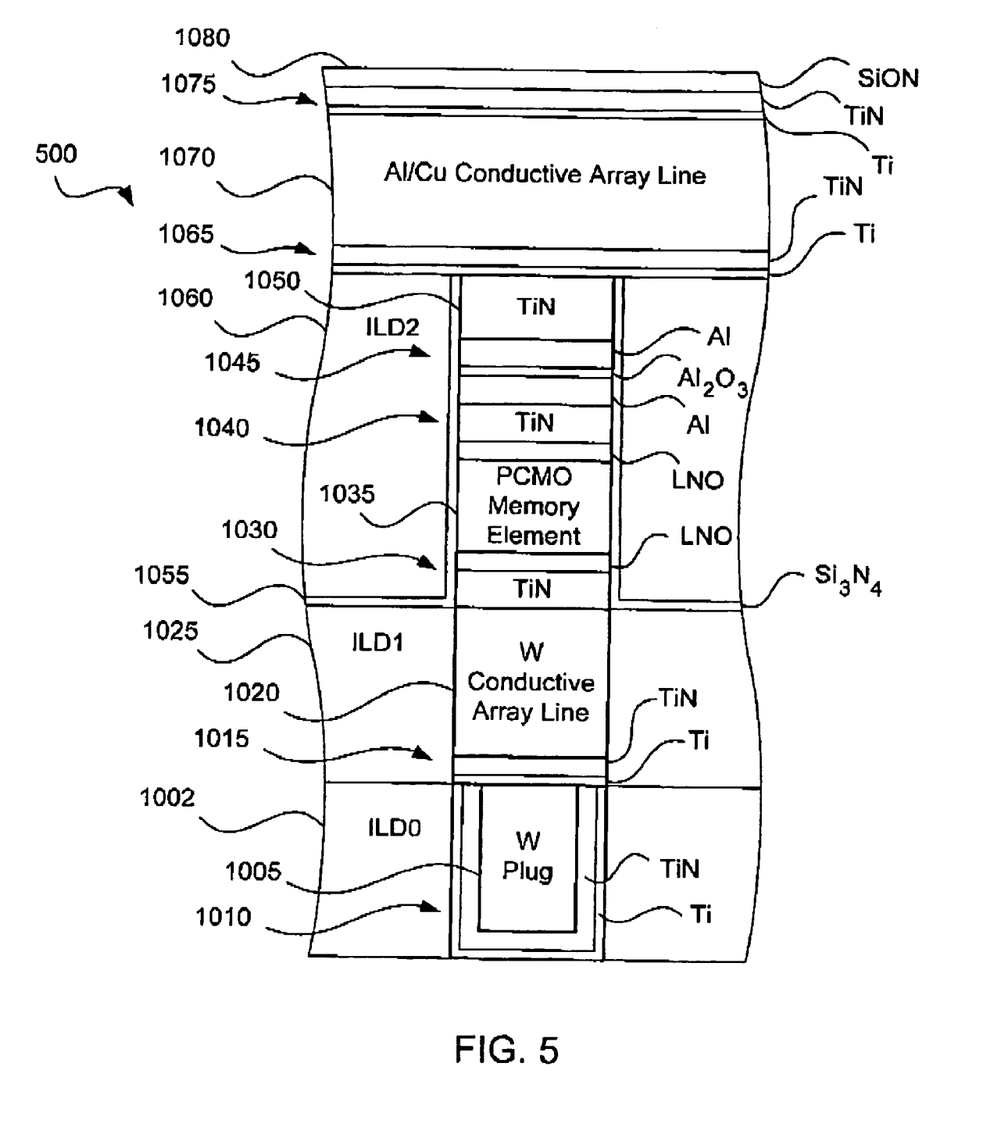
FIG. 5 depicts a detailed cross section of a memory cell in a cross point memory array.

FIG. 5 is a detailed cross section of a memory cell 500 in a cross point array using processing steps described in FIG. 4. A barrier/adhesion layer 1010 of 100 521 of Ti followed by 200 Å of TiN could be sputtered on the wafer, followed by 5000 Å of W deposited using CVD, followed by etchback or CMP to remove W on the ILD surface 1002, leaving W plugs 1005 in the contact holes.

Once the plugs are formed, the W conductive array lines 1020 are patterned. Since W has a relatively high resistivity, the maximum length and minimum cross-sectional area may be limited in comparison to aluminum or copper. Specifically, the maximum length and cross-sectional area of the conductive array lines 1020 can be determined using $R=\rho L/A$ and setting a maximum resistance to about 10 k$\Omega$ in order to maintain fast access times. Assuming 5000 Å thick metalllzation layers and a feature size of 0.25 µm, the length of the conductive array lines 1020 would be a maximum of about 2000 µm long. The W conductive any lines 1020 can be achieved through a barrier/adhesion layer 1015 of 100 Å of Ti plus 200 Å of TiN, followed by 5000 Å of W deposition through CVD, followed by mask, etch, and resist strip steps.

Another ILD layer 1025 could be deposited over the first layer of conductive array lines 1020. The dielectric layer 1025 can be a thick layer of $SiO_2$, deposited over the W conductive array lines 1020 by plasma-enhanced chemical vapor deposition (PECVD) and then planarized by CMP to expose the top surfaces of the W lines 1020.

The bottom electrodes 1030 are then deposited. First, a 500 Å thick barrier layer of TiN or TiAlN is deposited to prevent metal inter-diffusion, followed by a 200 Å conductive oxide layer of $LaNiO_3$ (LNO) or $SrRuO_3$ (SRO). These layers can be deposited by sputtering. Alternatively to the conductive oxide layer a 500 Å layer of Ir can be deposited, followed by a 200 Å layer of $IrO_2$. These layers can be deposited by reactive sputtering from an ir target, adding oxygen in the sputtering chamber to create the $IrO_2$ layer.

Then, approximately 2000 Å of multi-resistive state element 1035 having a stoichiometry of $Pr_{0.7}Ca_{0.3}MnO_3$ is deposited at about 600° C. by a physical vapor deposition technique such as sputtering. As previously explained, the multi-resistive state element 1035 would have a low resistance of 100 k Ohm and a high resistance of 1M Ohm, and would change state with a less than 50 ns flat pulse at 2V. Another electrode 1040 (200 Å of LNO or SRO and another 500 Å of TiN are deposited via sputtering) is deposited on top of the multi-resistive state element 1035.

The optional non-ohmic device 1045 can be formed by first sputtering 250 Å of Pt or Al, followed by 50 Å or less of $Al_2O_3$, and another 250 Å of sputtered Pt or Al. The $Al_2O_3$ could be formed by atomic layer deposition (ALD) or oxidization of Al. The $Al_2O_3$ thickness would be chosen to achieve a $V_{NO+}$ of 4V. After the optional non-ohmic device 1045, another 500 Å barrier layer 1050 of sputtered TiN is optionally deposited to prevent metal inter-diffusion.

Then, standard photolithography and appropriate multi-step etch processes could be used to pattern the memory/non-ohmic film stack into memory cell plugs. The spaces between the plugs could then be filled in by depositing a 250 Å etch stop/diffusion barrier 1055 of $Si_3N_4$, followed by a Thick $SiO_2$ interlayer dielectric (ILD) 1060, which is planarized by CMP.

An etch stop layer is used to ensure a thin-film does not get removed during processing. When etching a thin-film layer, the actual etch time is normally longer than that minimum time required to etch through the film. This overetch time, typically 20–50% of the minimum etch time, is added to allow for variations in film thickness and variations in etch rate due to pattern density. An etch stop layer, with an etch rate significantly lower than that of the film being etched, can be used to protect the layers beneath it from attack during the overetch time. The etch stop layer can later be removed or etched through in selected locations by using a different etch method (e.g. different chemistry) producing a high etch rate for the etch stop layer and a lower etch rate compared to underlying layers.

The diffusion barrier layer 1055 additionally protects the memory plugs from inter-diffusion with the surrounding dielectric 1060. Regardless of whether such an insulating barrier 1055 is necessary for the entire plug, or only certain components, it is often useful to coat the entire plug with the diffusion barrier layer 1055 for simplicity.

Although not shown in FIG. 5, via holes with W plugs could be formed to contact the tops of the memory cell islands and are one mechanism that can be used to provide connections between metal interconnect layers. Standard photolithography and a 2-step via etch (stopping first on the $Si_3N_4$ layer 1055, then etching through it) could be used to expose the tops of the memory cell islands. These via holes could be filled by depositing 100 Å of Ti, followed by 200 Å of TiN, followed by a 5000 Å W layer. CMP could then be used to remove W on the ILD surface 1060, leaving the W plugs in the via holes.

If there are no more memory elements to form at high temperature, the final layer of conductive array lines may comprise aluminum, copper or other high conductivity metal. A top layer of conductive array lines could then be formed by depositing, in order, another barrier/adhesion layer 1065 of 100 Å of Ti and 200 Å of TiN, then the conductive array line 1070 comprising 5000 Å of an Al/Cu mixture, and then a final barrier/adhesion layer 1075 of 100 Å of Ti, 200 Å of TiN. An anti-reflective coating (ARC) 1080, such as SiON could also be deposited. A final mask, etch and resist strip would then be performed. The final cross-point memory array could then be 16384 W conductive array lines by 4096 Al/Cu conductive array lines to create a 64 Mbit array. 16 of these arrays could be laid side-by-side to create a 1 Gbit memory.

High Temperature Fabrication

As previously described, the fabrication techniques used for the memory plug 255 or 310 will typically dictate the requirements of the layers beneath the memory plug (e.g., in a transistor memory array the select line 320; and in a cross point array 100 or 150 the driver circuitry and conductive lines 105, 175, 180, 190 and 195). Since certain fabrication processes (e.g., solution based spin on followed by high temperature anneal, pulsed laser deposition, sputtering, and metal-organic chemical vapor deposition) might require high temperatures, refractory metals can be used for these layers so that they may withstand the temperatures.

Typical metal lines in integrated circuits are made out of aluminum or copper. However, these metals have a rather low melting point, and the structural integrity of the formed metal lines is damaged if they are allowed to melt. Furthermore, these materials cannot even withstand exposure to temperatures below their melting point. For example, although aluminum's melting point is 660 C, it generally should not be exposed to temperatures above 400 C. At such temperatures the aluminum atoms start to diffuse to other areas, possibly reacting with other semiconductor elements on the substrate, disturbing the characteristics of those elements. The diffusion increases with increasing temperatures, becoming largely unworkable at 450 C.

Therefore, if typical low temperature conductive lines were used (i.e., aluminum or copper), any material above the first metal line would be limited to temperatures where they were considered to be "stable" metals. However, most manufacture processes require high temperatures to grow the crystalline or poly-crystalline structure of the multi-resistive state element. In such processes, high temperature is typically between 600 C and 800 C.

Therefore, using conductive lines that can withstand high temperatures is sometimes required. High melting point metals are usually referred to as refractory metals, and include tungsten, molybdenum, tantalum, niobium, chromium, vanadium and rhenium, as well as the less common zirconium, technetium, ruthenium, rhodium, hafnium, osmium and iridium. Some of the latter metals may, however, not be practical for use in an integrated circuit process. Refractory metals also include any compounds and alloys that have high melting points. Additionally, in many applications it is preferable to use a material with a low resistivity in order to both improve the memory access time and allow for longer array lines.

Additionally, any conductive material with a melting point of at least 100 C above the desired process temperature can typically be used. For example, in the case of aluminum, a desired process temperature 200 C. below the melting point of aluminum is generally preferred. Therefore, an optimum conductive array line would be a refractory metal with a low resistivity that has a melting point at least 100 C above the high temperature processing that is used.

Conductive lines are not the only elements that may need to withstand high temperature processing. Typically, only the layers that are deposited after the high temperature processing of the memory plug are free from high temperatures. Since no high temperature steps are required after the memory plug's formation, the top layers of the memory do not need to have high melting points. Therefore, such layers can be made with standard metallization materials such as aluminum, copper or aluminum alloys such as aluminum-silicon, aluminum-silicon-copper or aluminum-copper.

The elements that may need to withstand high temperature processing can include the multi-resistive state material, a possible non-ohmic device, appropriate electrodes, bottom layers of conductive array lines, and contact plugs to connect the electrodes of the memory cells to the conductive array lines. Electrodes made out of noble metals, binary or ternary oxides and nitrides, and conductive metal oxides are temperature resistant and have been described in detail in co-pending U.S. patent application, "Conductive Memory Device With Barrier Electrodes," U.S. application Ser. No. 10/682,277, filed Oct. 8, 2003, already incorporated by reference. The same application additionally describes sacrificial layers that can act as an oxygen barrier by reacting with oxygen while remaining electrically conductive. Examples of high temperature resistant materials that can act as a sacrificial layers include ternary oxides such as ruthenium tantalum oxide, ruthenium titanium oxide, iridium tantalum oxide or iridium titanium oxide and ternary nitrides such as ruthenium tantalum nitride, ruthenium titanium nitride, iridium tantalum nitride or iridium titanium nitride.

Concluding Remarks

Although the invention has been described in its presently contemplated best mode, it is clear that it is susceptible to numerous modifications, modes of operation and embodiments, all within the ability and skill of those familiar with the art and without exercise of further inventive activity. Accordingly, that which is intended to be protected by Letters Patent is set forth in the claims and includes all variations and modifications that fall within the spirit and scope of the claim.

What is claimed is:

1. A re-writeable cross point memory, comprising:
a substrate having a deposition face, the substrate including active circuitry having multiple layers of conductive paths, and the active circuitry and the multiple layers of conductive paths are able to withstand high temperature processing at a first temperature; and
a two-terminal cross point memory array positioned over the deposition face and over the active circuitry and including
a plurality of two-terminal memory cells, wherein at least a portion of the two-terminal memory cells are formed using high temperature processing at the first temperature,
a bottom refractory metal layer that has a melting point above the first temperature, the bottom refractory metal layer positioned parallel to the deposition face of the substrate and is patterned into bottom conductive array lines, and
a top metal layer that is not stable at the first temperature and postioned parallel to the deposition face of the substrate, patterned into top conductive array lines such that each two-terminal memory cell may be at least partially defined by the intersection of a bottom conductive array line and a top conductive array line, the two-terminal memory cell capable of being programmed by application of voltages on the bottom conductive array line and the top conductive array line.

2. The cross point memory of claim 1, wherein the resistance of the memory cells can be reversibly programmed to different values.

3. The cross point memory of claim 1, wherein the memory cells includes a crystalline or poly-crystalline material.

4. The cross point memory of claim 1, wherein the top metal layer is not a refractory metal.

5. The cross point memory of claim 4, wherein the top metal layer is copper, aluminum, or an aluminum alloy.

6. The cross point memory of claim 1, wherein the bottom refractory metal layer is tungsten, molybdenum or tantalum.

7. The cross point memory of claim 1, wherein the bottom refractory metal layer has a melting point of at least 700° C.

8. The cross point memory of claim 1, wherein the bottom refractory metal layer is stable at 600° C.

9. The cross point memory of claim 1, wherein each of the memory cells further include:
a multi-resistive state element including the at least two conductive metal oxide layers that are not identical to each other; and
an electrode that electrically connects the multi-resistive state element to a bottom conductive array line.

10. The cross point memory of claim 9, wherein the electrode includes a barrier layer, whereby inter-metal and oxygen diffusion is limited by the barrier layer during formation of the memory cell.

11. The cross point memory of claim 10, wherein the barrier layer includes either titanium or titanium nitride.

12. The cross point memory of claim 10, wherein the barrier layer is a binary nitride.

13. The cross point memory of claim 10, wherein the barrier layer is a ternary nitride.

14. The cross point memory of claim 9, wherein the electrode includes a sacrificial layer, whereby the sacrificial layer acts as an oxygen barrier layer by reacting with oxygen while remaining electrically conductive.

15. The cross point memory of claim 14, wherein the sacrificial layer is a ternary oxide.

16. The cross point memory of claim 15, wherein the ternary oxide is ruthenium tantalum oxide, ruthenium titanium oxide, iridium tantalum oxide or iridium titanium oxide.

17. The cross point memory of claim 14, wherein the sacrificial layer is a ternary nitride.

18. The cross point memory of claim 17, wherein the ternary nitride is ruthenium tantalum nitride, ruthenium titanium nitride, iridium tantalum nitride or iridium titanium nitride.

19. The cross point memory of claim 9, wherein the electrode includes a noble metal.

20. The cross point memory of claim 9, wherein the electrode includes a conductive metal oxide such as strontium ruthenate, lanthanum nickelate or iridium oxide.

21. The cross point memory of claim 1, further comprising:
refractory interconnect metal layers in-between the substrate and the bottom refractory metal layers.

22. The cross point memory of claim 1, further comprising: interconnect metal layers above the bottom refractory metal layer.

23. The cross point memory of claim 1, wherein there are at least two memory arrays, the at least two memory arrays are stacked upon one another, and the at least two memory arrays are positioned over the deposition face and over the active circuitry.

24. The cross point memory of claim 23, wherein one of the memory arrays is a topmost memory array, and all of the metal layers below the topmost memory array are refractory metal layers and at least one metal layer above the topmost memory layer is not a refractory metal layer.

25. The cross point memory of claim 1, wherein the memory cells include a conductive metal oxide.

26. The cross point memory of claim 25, wherein the conductive metal oxide comprises at least two conductive metal oxide layers that are not identical to each other.

27. The cross point memory of claim 1, wherein the memory cells include a non-ohmic device.

28. A re-writable memory, comprising:
a substrate including active circuitry having multiple layers of conductive paths and the active circuitry and the multiple layers of conductive paths are stable at a high temperature; and
a two-terminal cross point memory array positioned over the active circuitry and including
a plurality of two-terminal memory cells, each two-terminal memory cell including a multi-resistive state element, the multi-resistive state element being formed with a high-temperature fabrication process at the high temperature,
a plurality of conductive lines beneath the multi-resistive state element, the plurality of conductive lines being stable at the high temperature, and
a plurality of conductive lines above the multi-resistive state element.

29. The memory of claim 28, wherein the plurality of conductive lines above the multi-resistive state element are not stable at the high temperature.

30. The memory of claim 28, wherein the multi-resistive state element is re-writeable.

31. The memory of claim 28, wherein a plurality of electrodes that are stable at the high temperature are formed beneath the multi-resistive state element.

32. The memory of claim 28, wherein each of the plurality of electrodes includes a barrier layer.

33. The memory of claim 28, wherein each of the plurality of electrodes includes an adhesion layer.

34. The memory of claim 28, wherein each of the plurality of electrodes includes a sacrificial layer.

35. The memory of claim 28, wherein a plurality of contact plugs that are stable at the high temperature are formed beneath the multi-resistive state element.

36. A re-writable memory, comprising:
a substrate;
a plurality of active circuits on the substrate and including multiple layers of conductive paths, the active circuits and the multiple layers of conductive paths are stable at a temperature of at least 450° C.;
a plurality of x-direction lines in a first metal layer parallel to the substrate, positioned above the active circuitry and stable at a temperature of at least 450° C., with the x-direction lines oriented in one direction;
a plurality of y-direction lines in a second metal layer above the first metal layer, with the y-direction lines oriented in a different direction as the x-direction lines, and crossing the x-direction lines; and
a plurality of two-terminal memory plugs located substantially at the intersections of the x-direction lines and y-direction lines, and in-between the first and second metal layers,
wherein the two-terminal memory plugs have at least one layer that requires the minimum temperature for fabrication greater than 450° C.

37. The memory of claim 36, wherein:
the first metal is a refractory metal.

38. The memory of claim 36, wherein: the second metal is not capable of sustaining processing temperature above 450° C.

39. The memory of claim 36, wherein: the second metal is aluminum or an aluminum alloy.

40. The memory of claim 36, wherein: the second metal is copper.

41. The memory of claim 36, further comprising:
at least one metal layer placed in-between the first metal layer and the substrate,
wherein the at least one metal layer placed in-between the first metal layer and the substrate is tungsten.

42. The memory of claim 36, further comprising:
at least one electrode in each memory plug,
wherein the at least one electrode includes a noble metal.

43. The re-writable memory of claim 42, wherein: the at least one electrode includes iridium, platinum or gold.

44. The re-writable memory of claim 36, further comprising:
at least one electrode in each memory plug;
wherein the at least one electrode includes a conductive metal oxide.

45. The re-writable memory of claim 44, wherein the at least one electrode includes strontium ruthenate, lanthanum nickelate or iridium oxide.

46. The re-writable memory of claim 36, wherein the memory plugs each include:
a non-ohmic device;
an electrode that electrically connects the multi-resistive state element to the non-ohmic device;
an electrode that electrically connects the memory plug to an x-direction line; and
an electrode that electrically connects the memory plug to a y-direction line.

47. A method of manufacturing a re-writable memory comprising:
providing a semiconductor substrate including active circuitry having multiple layers of conductive paths, the active circuitry and the multiple layers of conductive paths are stable at a first temperature; and
forming above the active circuitry a two-terminal cross point memory array including a bottom plurality of layers that are stable at the first temperature,
forming a multi-resistive state element layer at the first temperature after the bottom plurality of layers are formed; and
forming a top plurality of layers after the multi-resistive state element layer is formed, wherein at least one of the layers in the top plurality of layers is not stable at the first temperature.

* * * * *

UNITED STATES PATENT AND TRADEMARK OFFICE
CERTIFICATE OF CORRECTION

PATENT NO. : 7,042,035 B2
APPLICATION NO. : 10/765406
DATED : May 9, 2006
INVENTOR(S) : Darrell Rinerson et al.

It is certified that error appears in the above-identified patent and that said Letters Patent is hereby corrected as shown below:

Kindly Correct the following Errors on part of the APPLICANT as set forth in (a) - (f) below:

(a) In regards to Claim 9 in the Claims,

In Column 13, Line 13, AFTER the word "including", please DELETE the word "the".

(b) In regards to Claim 36 in the Claims,

In Column 14, Line 59, after the word "requires", please DELETE the word "the" and REPLACE with the word --a--.

(c) In regards to Claim 37 in the Claims,

In Column 14, Line 63, after the words "second metal", please INSERT the word --layer--

(d) In regards to Claim 38 in the Claims,

In Column 14, Line 63, after the words "second metal", please INSERT the word --layer-- AND In Column 14, Line 64, please DELETE the word "temperature" and REPLACE with the word --temperatures--.

UNITED STATES PATENT AND TRADEMARK OFFICE
CERTIFICATE OF CORRECTION

PATENT NO.       : 7,042,035 B2
APPLICATION NO.  : 10/765406
DATED            : May 9, 2006
INVENTOR(S)      : Darrell Rinerson et al.

It is certified that error appears in the above-identified patent and that said Letters Patent is hereby corrected as shown below:

(e) In regards to Claim 39 in the Claims,

In Column 14, Line 66, after the words "second metal", please INSERT the word --layer--.

(f) In regards to Claim 40 in the Claims,

In Column 15, Line 1, after the words "second metal", please INSERT the word --layer--.

Signed and Sealed this

Twenty-sixth Day of September, 2006

JON W. DUDAS
*Director of the United States Patent and Trademark Office*